United States Patent
Lecheler et al.

(10) Patent No.: US 10,796,832 B2
(45) Date of Patent: Oct. 6, 2020

(54) DETERMINING THE MOVEMENT PROFILE OF AN ARMATURE IN A MAGNET

(71) Applicant: SIEMENS AKTIENGESELLSCHAFT, Munich (DE)

(72) Inventors: Stefan Lecheler, Berlin (DE); Mario Schaefer, Potsdam (DE)

(73) Assignee: Siemens Aktiengesellschaft, Munich (DE)

( * ) Notice: Subject to any disclaimer, the term of this patent is extended or adjusted under 35 U.S.C. 154(b) by 48 days.

(21) Appl. No.: 16/099,751

(22) PCT Filed: Apr. 24, 2017

(86) PCT No.: PCT/EP2017/059622
§ 371 (c)(1),
(2) Date: Nov. 8, 2018

(87) PCT Pub. No.: WO2017/194295
PCT Pub. Date: Nov. 16, 2017

(65) Prior Publication Data
US 2019/0156982 A1  May 23, 2019

(30) Foreign Application Priority Data
May 9, 2016 (DE) .......... 10 2016 207 915

(51) Int. Cl.
*H01F 7/18* (2006.01)
*G01R 31/34* (2020.01)
(Continued)

(52) U.S. Cl.
CPC ....... *H01F 7/1844* (2013.01); *G01R 19/0092* (2013.01); *G01R 31/3274* (2013.01);
(Continued)

(58) Field of Classification Search
CPC ............. H01F 7/1844; H01F 2007/185; G01R 19/0092; G01R 31/3274; G01R 31/34;
(Continued)

(56) References Cited

U.S. PATENT DOCUMENTS

2007/0041131 A1  2/2007 Kesselgruber et al.
2012/0319700 A1  12/2012 Keller et al.
(Continued)

FOREIGN PATENT DOCUMENTS

| DE | 3817770 A1 | 11/1989 |
| DE | 102005038934 A1 | 2/2007 |
| DE | 102011077363 A1 | 12/2012 |

*Primary Examiner* — Melissa J Koval
*Assistant Examiner* — Trung Nguyen
(74) *Attorney, Agent, or Firm* — Laurence Greenberg; Werner Stemer; Ralph Locher

(57) ABSTRACT

A method and a device determine a movement profile of a solenoid plunger in a solenoid for monitoring a plunger-type armature movement for changes. The solenoid is an electromagnet in which a magnetic field can be generated by an electrical coil and a measuring unit is connected to the electrical coil. The method includes measuring a current profile with respect to time when the solenoid is operated, examining a measured current profile with respect to time for a position of a first reversal point in respect of time after operation of the solenoid and a current intensity, and assigning the position of the first reversal point to a movement end of the plunger-type armature.

8 Claims, 1 Drawing Sheet

(51) Int. Cl.
*H01H 11/00* (2006.01)
*G01R 19/00* (2006.01)
*G01R 31/72* (2020.01)
*G01R 31/327* (2006.01)
*G05B 23/02* (2006.01)
*H01H 33/38* (2006.01)

(52) U.S. Cl.
CPC ............ *G01R 31/34* (2013.01); *G01R 31/72* (2020.01); *G05B 23/0267* (2013.01); *H01F 2007/185* (2013.01); *H01H 11/0062* (2013.01); *H01H 33/38* (2013.01)

(58) Field of Classification Search
CPC ............... G01R 31/72; G05B 23/0267; H01H 11/0062; H01H 33/38
USPC ........ 324/200, 378, 388, 118–143, 435, 500, 324/546, 723, 714, 74, 103 R, 114
See application file for complete search history.

(56) References Cited

U.S. PATENT DOCUMENTS

2014/0129159 A1\* 5/2014 Ho .................... G01R 31/3278 702/58
2016/0125993 A1\* 5/2016 Narayanasamy ..... H01F 7/1844 361/160

\* cited by examiner

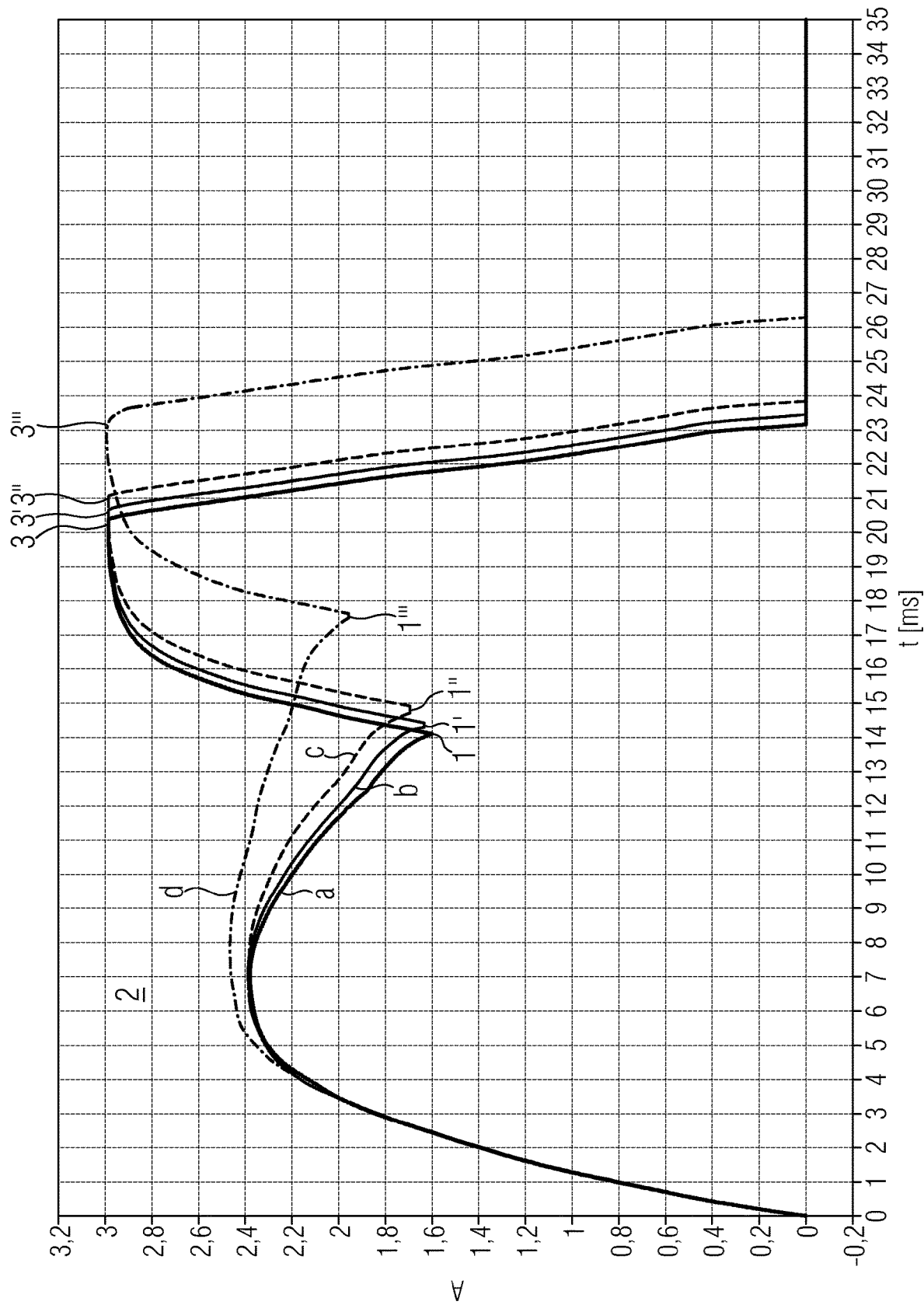

DETERMINING THE MOVEMENT PROFILE OF AN ARMATURE IN A MAGNET

BACKGROUND OF THE INVENTION

Field of the Invention

The invention relates to a method and to an apparatus for determining the movement profile of a plunger-type armature in a solenoid.

In solenoids, also called linear solenoids, the internal mechanical friction between the bearing of the solenoid and the plunger-type armature, which is also called a plunger-type core, changes. The cause of the change in the internal mechanical friction is based, amongst other things, on mechanical wear, soiling in the bearing and/or external magnetic fields. As a result of these changes, the movement sequence of the plunger-type armature and therefore the force provided by the solenoid comprising the plunger-type armature change. A problem is encountered, in particular, when an increase in the internal mechanical friction leads to prolonging of the movement sequence of the plunger-type armature and/or to a reduction in the force which is provided by the plunger-type armature.

In the prior art, changes in the movement sequence of the plunger-type armature are usually identified by additional movement sensors and/or end contacts.

An evaluation unit then monitors the time period from when the solenoid is switched on to the point at which the end position of the plunger-type armature is released and then compares the measured value with a prespecified setpoint value. The evaluation unit can then generate an error message when there is a predefined deviation from the prespecified setpoint value.

SUMMARY OF THE INVENTION

The object of the invention, then, is to provide a more expedient and more reliable method for determining the movement profile of a plunger-type armature in a solenoid and/or for identifying the increase in mechanical friction between the bearing and the plunger-type armature, which method manages, in particular, without additional end contacts or movement sensors.

This object is achieved in accordance with the method as claimed in the main method claim, the switch as claimed in the main switch claim and the switchgear installation as claimed in the main switchgear claim.

The invention proposes a method for determining the movement profile of a plunger-type armature in a solenoid, that is to say also for the purpose of monitoring the plunger-type armature movement for changes, wherein the solenoid is an electromagnet in which the magnetic field can be generated by means of an electrical coil, wherein a measuring unit is connected to the electrical coil, wherein the current profile with respect to time is measured when the solenoid is operated, the measured current profile with respect to time is examined for the position of a first reversal point in respect of time after operation of the solenoid and the current intensity, and wherein the position of the first reversal point in the measured current profile with respect to time is assigned to the movement end of the plunger-type armature and/or describes said movement end.

A method for determining the movement profile of a plunger-type armature in a solenoid is also preferred, wherein the measured current profile is examined for the position of a first local maximum of the current, the measured current profile is examined for the position of a second local maximum of the current, and the measured current profile is examined for the position of a first reversal point between the first local maximum and the second local maximum, and wherein the position of the first reversal point is assigned to the movement end of the plunger-type armature and/or describes said movement end.

It is also preferred that the position of the first reversal point is compared with a reference position.

It is further preferred that a shift in the position of the first reversal point toward longer times after operation of the solenoid is assessed as a slowdown of the movement of the plunger-type armature in comparison to the reference position.

It is also preferred that a shift in the position of the first reversal point toward larger current intensities is assessed as an increase in friction losses in comparison to the reference position.

It is also preferred that the reference position of the reversal point can be defined by a reference measurement, and that, in subsequent operations of the solenoid, the position of the first reversal point is determined and compared with the reference position of the reversal point.

It is further preferred that a fault signal is generated by the measuring unit when the position of the first reversal point deviates from the reference position of the reversal point by a predetermined or predeterminable time.

It is also preferred that the method for determining the movement profile of a plunger-type armature in a solenoid is employed in a medium-voltage and/or high-voltage switchgear installation.

It is also preferred that the method for determining the movement profile of a plunger-type armature in a solenoid is used in a medium-voltage and/or high-voltage switchgear installation and the fault signal which is generated by the measuring unit triggers a warning message and/or fault message at the switchgear installation.

A medium-voltage and/or high-voltage switch, in particular a vacuum switch, comprising a solenoid and a plunger-type armature for triggering a switching movement is also preferred, wherein the movement profile of the plunger-type armature is determined in accordance with one of the above-described methods.

A medium-voltage and/or high-voltage switchgear installation comprising a solenoid and a plunger-type armature for triggering a switching movement is further preferred, wherein the movement profile of the plunger-type armature is determined in accordance with one of the above-described methods.

It is further preferred that the switchgear installation has a communication unit which is connected to the measuring unit and the communication unit is designed to transmit the position of the first reversal point and/or of the first reversal point in relation to the reference position of the first reversal point and/or the fault signal to a further communication unit.

In particular, it is also preferred that the further communication unit is connected to a control center which receives the position of the first reversal point and/or the position of the first reversal point in relation to the reference position of the first reversal point and/or the fault signal and generates a corresponding warning message.

BRIEF DESCRIPTION OF THE SEVERAL VIEWS OF THE DRAWING

The subject matter of the invention will be explained in more detail below with reference to a FIGURE:

FIG. 1: illustration of the time profile of the current after operation of the solenoid.

DESCRIPTION OF THE INVENTION

FIG. 1 shows the time profile of the current after operation of the solenoid. In FIG. 1, the amplitude A of the current is plotted with respect to time t, wherein, for example, the amplitude A is illustrated in arbitrary units and the time t is illustrated in ms here. Said FIGURE shows four current profiles, wherein the current profile a corresponds to a reference measurement and has a first local maximum 2, a first reversal point 1, also called the reference position or reference position of the first reversal point, and a second local maximum 3.

Here, the reversal point 1 indicates the movement end of the plunger-type armature.

The current profile b shows a current profile in the event of increased friction between the bearing of the solenoid and the plunger-type armature of the solenoid. The current profile b has, in comparison to the current profile a, a reversal point 1' which is shifted in respect of time toward a longer time after operation of the solenoid, and has an increased amplitude of the current at the reversal point 1'.

The current profile c shows a current profile in the event of friction between the bearing of the solenoid and the plunger-type armature of the solenoid, which friction is increased in relation to the current profiles a and b. The reversal point 1" is shifted toward a longer time and toward a higher amplitude of the current intensity in relation to the reversal points of the current profiles a and b.

The current profile d shows the current profile after operation of the solenoid with a greatly increased friction between the bearing of the solenoid and the plunger-type armature of the solenoid. The reversal point 1''' of the current profile d is shifted significantly toward longer times and toward higher currents.

It should be noted that, even in the case of the current profiles a, b, c and d, the second maximum 3, 3', 3", 3''' is shifted toward longer times as the friction between the bearing of the solenoid and the plunger-type armature of the solenoid increases.

Therefore, the current profiles can be used to perform a functional check which identifies a changed movement sequence of the plunger-type armature in the solenoid and/or a changed friction between the bearing of the solenoid and the plunger-type armature of the solenoid.

The invention claimed is:

1. A method for determining a movement profile of a plunger-type armature in a solenoid for monitoring a plunger-type armature movement for changes, the solenoid being an electromagnet in which a magnetic field can be generated by means of an electrical coil, and a measuring unit is connected to the electrical coil, which comprises the steps of:
    measuring a current profile with respect to time when the solenoid is operated;
    examining a measured current profile with respect to time for a position of a first reversal point in respect of the time after operation of the solenoid and a current intensity;
    assigning the position of the first reversal point to a movement end of the plunger-type armature; and
    comparing the position of the first reversal point with a reference position, wherein a shift in the position of the first reversal point toward longer times after operation of the solenoid is assessed as a slowdown of a movement of the plunger-type armature in comparison to the reference position, wherein a shift in the position of the first reversal point toward lamer current intensities is assessed as an increase in friction losses in comparison to the reference position, and wherein the reference position of the first reversal point can be defined by a reference measurement, and in that, in subsequent operations of the solenoid, the position of the first reversal point is determined and compared with the reference position of the first reversal point.

2. The method for determining the movement profile of the plunger-type armature in the solenoid according to claim 1, which further comprises:
    examining the measured current profile for a position of a first local maximum of a current;
    examining the measured current profile for a position of a second local maximum of the current;
    examining the measured current profile for the position of the first reversal point between the first local maximum and the second local maximum; and
    assigning the position of the first reversal point to the movement end of the plunger-type armature.

3. The method for determining the movement profile of the plunger-type armature in the solenoid according to claim 1, which further comprises generating a fault signal via the measuring unit when the position of the first reversal point deviates from the reference position of the reversal point by a predetermined or predeterminable time.

4. The method for determining the movement profile of the plunger-type armature in the solenoid according to claim 3, which further comprises determining the movement profile in a medium-voltage and/or high-voltage switchgear installation.

5. The method for determining the movement profile of the plunger-type armature in the solenoid according to claim 3, which further comprises determining the movement profile in a medium-voltage and/or high-voltage switchgear installation and that the fault signal which is generated by the measuring unit triggers a warning message and/or fault message at the switchgear installation.

6. A medium-voltage and/or high-voltage switch, comprising:
    a solenoid having an electrical coil, an electromagnet in which a magnetic field can be generated by means of said electrical coil, and a measuring unit connected to said electrical coil;
    a plunger-type armature for triggering a switching movement, wherein a movement profile of said plunger-type armature is determined by:
        measuring a current profile with respect to time when said solenoid is operated;
        examining a measured current profile with respect to time for a position of a first reversal point in respect of time after operation of said solenoid and a current intensity;
        assigning the position of the first reversal point to a movement end of said plunger-type armature; and
        comparing the position of the first reversal point with a reference position, wherein a shift in the position of the first reversal point toward longer times after operation of the solenoid is assessed as a slowdown of a movement of the plunger-type armature in comparison to the reference position, wherein a shift in the position of the first reversal point toward lamer current intensities is assessed as an increase in friction losses in comparison to the reference position, and wherein the reference position of the first reversal point can be defined by a reference measurement, and in that, in subsequent operations of the solenoid, the position of the first reversal point is determined and compared with the reference position of the first reversal point.

7. A medium-voltage and/or high-voltage switchgear installation, comprising:
   a solenoid having an electrical coil, an electromagnet in which a magnetic field can be generated by means of said electrical coil, and a measuring unit connected to said electrical coil;
   a plunger-type armature for triggering a switching movement, wherein a movement profile of said plunger-type armature is determined by:
   measuring a current profile with respect to time when said solenoid is operated;
   examining a measured current profile with respect to time for a position of a first reversal point in respect of time after operation of said solenoid and a current intensity;
   assigning the position of the first reversal point to a movement end of said plunger-type armature; and
   comparing the position of the first reversal point with a reference position, wherein a shift in the position of the first reversal point toward longer times after operation of the solenoid is assessed as a slowdown of a movement of the plunger-type armature in comparison to the reference position, wherein a shift in the position of the first reversal point toward larger current intensities is assessed as an increase in friction losses in comparison to the reference position, and wherein the reference position of the first reversal point can be defined by a reference measurement, and in that, in subsequent operations of the solenoid, the position of the first reversal point is determined and compared with the reference position of the first reversal point.

8. The medium-voltage and/or high-voltage switchgear installation according to claim 7, further comprising a communication unit which is connected to said measuring unit and said communication unit is configured to transmit the position of the first reversal point and/or the position of the first reversal point in relation to a reference position of the first reversal point and/or a fault signal to a further communication unit.

* * * * *